United States Patent [19]

Maeder

[11] 3,974,451

[45] Aug. 10, 1976

[54] TV REMOTE CONTROLLER

[75] Inventor: Heinz B. Maeder, Tempe, Ariz.

[73] Assignee: Motorola, Inc., Chicago, Ill.

[22] Filed: July 31, 1975

[21] Appl. No.: 601,119

[52] U.S. Cl. .................................. 325/392; 325/55; 343/228; 340/171 PF; 340/171 A; 179/15 BA

[51] Int. Cl.² ........................................... H04J 3/06

[58] Field of Search .......... 325/392, 55; 179/15 BA

[56] References Cited
UNITED STATES PATENTS

3,931,472   1/1976   Gill ................................ 179/15 BA

*Primary Examiner*—Harold Pitts
*Attorney, Agent, or Firm*—Thomas G. Watkins, III; Harry M. Weiss

[57] ABSTRACT

An asynchronous receiver system for remotely controlling an apparatus and capable of being substantially completely constructed on a single integrated circuit chip. This system includes an input stage means for receiving during successive receiving cycles an incoming signal comprising repetitive groups of serially received frequency bursts. Each burst is composed of one of a plurality of frequencies and the frequency of the incoming signal lies between harmonic frequencies of interfering signals. A frequency divider means sequentially generates a plurality of localizer frequencies at a first output terminal and a plurality of timing signals at a second plurality of output terminals. Each timing signal is associated with one of the plurality of localizer frequencies. A mixer receives inputs from the input stage and from the first output terminal and generates sum and difference signals in response to the incoming signal and to the plurality of localizer frequencies. A detector is coupled to the mixer and transmits signals of a selected frequency and amplitude range. A gating means is coupled to the detector and to the second plurality of output terminals. Each gating means is responsive to one of the plurality of timing signals and generates during successive receiving cycles successive groups of digital signals. Each of these digital signals represents one of the plurality of received frequency bursts. A memory means is coupled to the gating means and stores the digital signals. An error checking circuit is coupled to the output of the memory means and compares successive groups of digital signals in order to provide error-free operation.

14 Claims, 8 Drawing Figures

| | TRANSMITTER | | | RECEIVER | |
|---|---|---|---|---|---|
| NOM. U.S. FREQ. | | DIVIDING RATIO | NOM. LOC. OSC. FREQ. | DIVIDING RATIO | $f_{LOC}-f$ |
| $f_A$ = 34,688 Hz | | 26.5 | $f_{LOCA}$ = 41,248 Hz | 31 | 7260 Hz |
| $f_B$ = 36,048 Hz | | 25.5 | $f_{LOCB}$ = 43,347 Hz | 30 | 7238 Hz |
| $f_C$ = 37,519 Hz | | 24.5 | $f_{LOCC}$ = 44,841 Hz | 25 | 7322 Hz |
| $f_D$ = 39,116 Hz | | 23.5 | $f_{LOCD}$ = 46,422 Hz | 28 | 7326 Hz |
| $f_{E1}$ = 40,854 Hz | | 22.5 | $f_{LOCE1}$ = 48,163 Hz | 27 | 7308 Hz |
| $f_{E2}$ = 42,755 Hz | | 21.5 | $f_{LOCE2}$ = 50,015 Hz | 26 | 7260 Hz |

TRANSMITTER: $f_{REFNOM}$ = 919,232 Hz.  RECEIVER: $f_{REFNOM}$ = 1,300,400 Hz

| CHANNEL | $f_A$ | $f_B$ | $f_C$ | $f_D$ | $f_E$ | $\overline{M}$ | $\overline{N}$ | $\overline{O}$ | $\overline{P}$ | FUNCTION | |
|---|---|---|---|---|---|---|---|---|---|---|---|
| 1  | 0 | 0 | 0 | 0 | 1 |   |   |   |   | PR1  | ⎫ |
| 2  | 1 | 0 | 0 | 0 | 1 |   |   |   |   | PR2  |   |
| 3  | 0 | 1 | 0 | 0 | 1 |   |   |   |   | PR3  |   |
| 4  | 1 | 1 | 0 | 0 | 1 |   |   |   |   | PR4  |   |
| 5  | 0 | 0 | 1 | 0 | 1 |   |   |   |   | PR5  |   |
| 6  | 1 | 0 | 1 | 0 | 1 |   |   |   |   | PR6  | ⎬ ON |
| 7  | 0 | 1 | 1 | 0 | 1 |   |   |   |   | PR7  |   |
| 8  | 1 | 1 | 1 | 0 | 1 |   |   |   |   | PR8  |   |
| 9  | 0 | 0 | 0 | 1 | 1 |   |   |   |   | PR9  |   |
| 10 | 1 | 0 | 0 | 1 | 1 |   |   |   |   | PR10 |   |
| 11 | 0 | 1 | 0 | 1 | 1 |   |   |   |   | PR11 |   |
| 12 | 1 | 1 | 0 | 1 | 1 |   |   |   |   | PR12 | ⎭ |
| 13 | 0 | 1 | 0 | 0 | 0 | 1 | 0 | 1 | 1 | CS−  | ⎱ COLOR |
| 14 | 1 | 1 | 0 | 0 | 0 | 0 | 0 | 1 | 1 | CS+  | ⎰ SATURATION |
| 15 | 0 | 0 | 1 | 0 | 0 | 1 | 1 | 0 | 1 | VO−  | ⎱ VOLUME |
| 16 | 1 | 0 | 1 | 0 | 0 | 0 | 1 | 0 | 1 | VO+  | ⎰ |
| 17 | 0 | 1 | 1 | 0 | 0 | 1 | 0 | 0 | 1 | BR−  | ⎱ BRIGHTNESS |
| 18 | 1 | 1 | 1 | 0 | 0 | 0 | 0 | 0 | 1 | BR+  | ⎰ |
| 19 | 0 | 0 | 0 | 1 | 0 | 1 | 1 | 1 | 0 | STB  | STANDBY |
| 20 | 1 | 0 | 0 | 1 | 0 | 0 | 1 | 1 | 0 | QT   | QUICKTONE |
| 21 | 0 | 1 | 0 | 1 | 0 | 1 | 0 | 1 | 0 | D21  | ⎱ EXTRA CONTROL |
| 22 | 1 | 1 | 0 | 1 | 0 | 0 | 0 | 1 | 0 | D22  | ⎰ CHANNELS |
|    |   |   |   |   |   | 1 | 1 | 0 | 0 | PR+  | ⎱ PROGRAM |
|    |   |   |   |   |   | 0 | 1 | 0 | 0 | PR−  | ⎰ COUNTER |
|    |   |   |   |   |   | 1 | 0 | 0 | 0 | $\overline{\text{MDA}}$ | |
|    |   |   |   |   |   | 0 | 1 | 1 | 0 | ON   | |
|    |   |   |   |   |   | 0 | 0 | 0 | 0 | TEST | |

Channels 13–22 are labeled DIRECT COMMANDS.

FIG. 6

TV REMOTE CONTROLLER

BACKGROUND OF THE INVENTION

This invention relates to remote control operation of a complex apparatus, and more particularly, to a 22 channel remote control receiver operating in the ultrasonic sound spectrum for controlling a television receiver.

Most present day remote control systems for television receivers operate in the ultrasonic frequency range. The ultrasonic signal is typically generated by causing a mechanical hammer to strike a metallic rod which is tuned to be resonant at a certain frequency. The receiver typically utilizes a transducer to convert this ultrasonic sound wave into an electrical signal which is then amplified. The ultrasonic receiver generally contains a number of resonant reed devices each of which is tuned to be resonant at a frequency corresponding to one of the transmitted signals. When one of the transmitter tuned rods is struck it sends out an ultrasonic sound wave of a predetermined frequency which is picked up by the remote control receiver where the corresponding resonant reed is energized. This causes the remote control receiver to execute the desired command. A system like this is quite simple in concept, but is expensive. A great deal of mechanical assembly is required to construct the transmitter tuning rods and hammer mechanisms as well as constructing and individually tuning each of the resonant tuned circuits in the receiver. A system like this is very limited in the number of functions which it can control since only about five tuned rods can be contained in a transmitter case of reasonable size. When changing from channel to channel the user is only able to remotely control either an up command or a down command to the channel changer. For example, to change from channel 5 to channel 10, the user must transmit the up command to sequentially run through channels 6, 7, 8, 9 until arriving at channel 10. This system also has inherent difficulties with preventing randomly generated noise signals from activating the remote control receiver. This is normally circumvented by greatly reducing the sensitivity of the remote control receiver so that only a very strong input signal will cause the remote control receiver to operate. Due to this low sensitivity the user must often transmit the desired command several times or must come closer to the television set to ensure that a sufficient signal strength is received by the remote control receiver.

Some very recently developed remote control systems utilize a continuous wave (C.W.) transmitter capable of generating 15–30 discrete ultrasonic frequencies each of which is able to control a separate function. The difficulty with this system is that each transmitter frequency must be very closely controlled requiring the use of crystals and high accuracy components. Due to the close frequency spacing Doppler shift caused by motion, incorrect commands will be executed if the user moves the transmitter while it is transmitting. Also, since this system has no error checking circuit, it is sensitive to random noise in the ultrasonic range. Noise of this type is often generated by jingling keys on a keychain.

OBJECTS OF THE INVENTION

It is an object of this invention to provide a 22 channel ultrasonic remote control receiver system substantially completely constructed on a single integrated circuit chip.

It is another object of the invention to provide a 22 channel ultrasonic remote control receiver system having a heterodyne frequency conversion stage.

A further object of this invention is to provide a 22 channel ultrasonic remote control receiver system having an error checking circuit and a narrow bandwidth of operation.

It is still another object of this invention to provide a 22 channel ultrasonic remote control receiver system having only two tuned circuits, one of which is a bandpass filter.

SUMMARY OF THE INVENTION

Briefly described, a 22 channel ultrasonic remote control receiver system is provided for receiving an incoming signal composed of repetitive groups of serially transmitted frequency bursts, where each burst has one of a plurality of frequencies and where each group of bursts corresponds to a predetermined transmitted command. This received series of frequency bursts is mixed with a sequentially incremented local oscillator signal to produce sum and difference signals at the output of a mixer. The mixer output is coupled to a detector stage which transmits only signals having a selected frequency and amplitude range. The detected signal is then fed to a gating circuit which converts the detected signal into a plurality of digital signals where each of the digital signals corresponds to one of the plurality of frequencies of the incoming frequency bursts. The output of the gating circuit is coupled to a memory. An error checking circuit is coupled to the memory to compare successive outputs of the gating circuit. If the error checking circuit senses a consistent digital signal during a predetermined number of receiving cycles, it transmits that digital signal on to an instruction decoder. The instruction decoder then distributes the received command to one of three control circuits which directly control selected functions.

DETAILED DESCRIPTION OF THE INVENTION

Figure 1:
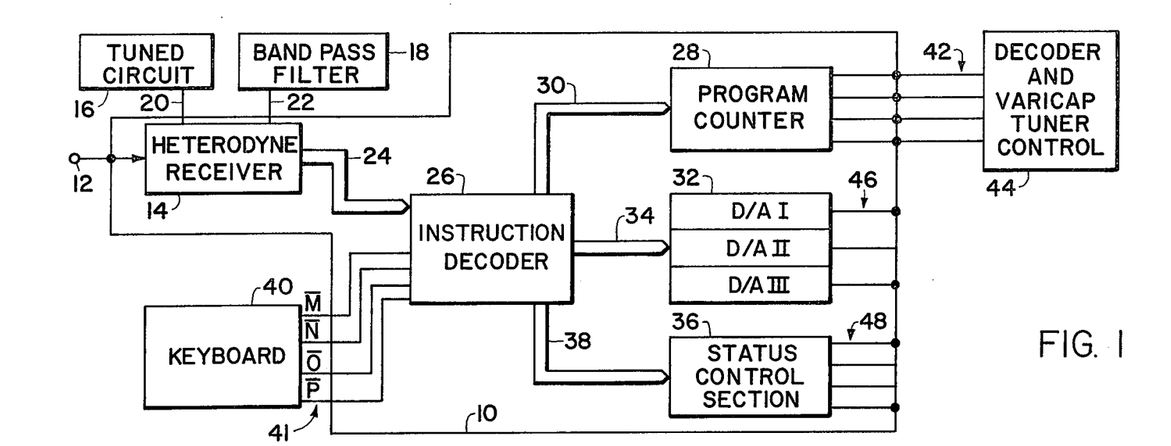
FIG. 1 is a generalized block diagram showing a hardware embodiment of the invention system.

In order to better illustrate the advantages of the invention and its contribution to the art, a preferred hardware embodiment will now be described in some detail. The overall operation of the invention will be first described with reference to FIG. 1. In FIG. 1, the integrated circuit remote control receiver system 10 receives the amplified ultrasonic signal from input line 12. Heterodyne receiver 14 internally performs the signal processing and error checking functions. The external tuned circuit 16 is coupled to heterodyne receiver 14 by line 20. Tuned circuit 16 is composed of discrete components and is used to set the reference frequency $f_r$ for heterodyne receiver 14. Band pass filter 18 is also composed of discrete components external to the integrated circuit 10 and is coupled to the heterodyne receiver 14 by line 22. A plurality of outputs 24 couples the binary output of heterodyne receiver 14 to instruction decoder 26. Instruction decoder 26 branches different types of instructions from heterodyne receiver 14 into three groups according to the function designated by each group of binary outputs. Instruction decoder 26 routes binary outputs corresponding to channel selection instructions to program counter 28 via a plurality of output lines 30. Instruction decoder 26 routes outputs corresponding to analog controls such as brightness, color intensity and volume to digital to analog converter 32 via a plurality of outputs 34. Instruction decoder 26 routes status control commands to status control section 36 via a plurality of output lines 38. Instruction decoder 26 can either be addressed by heterodyne receiver 14 or by the keyboard 40 located directly on the television set and coupled to instruction decoder 26 by a plurality of outputs 41. The output of program counter 28 is sent via a plurality of outputs 42 to decoder and varicap tuner control 44 which is external to the integrated circuit and which is used to develop an analog voltage for use with a varicap tuner to select a desired channel. The output of digital to analog converter 32 is coupled via a plurality of outputs 46 to the volume control, brightness control and color saturation control on the television receiver. The outputs of status control section 36 are coupled to a plurality of output conductors 48 to control the functions of turning the television receiver from standby to on and from on to standby. The muting signal which mutes the audio portion of the television output at the speaker is also derived from this plurality of outputs 48. Status control section 36 contains two additional outputs 48 which can perform any additional functions which the user desires.

Figure 2:
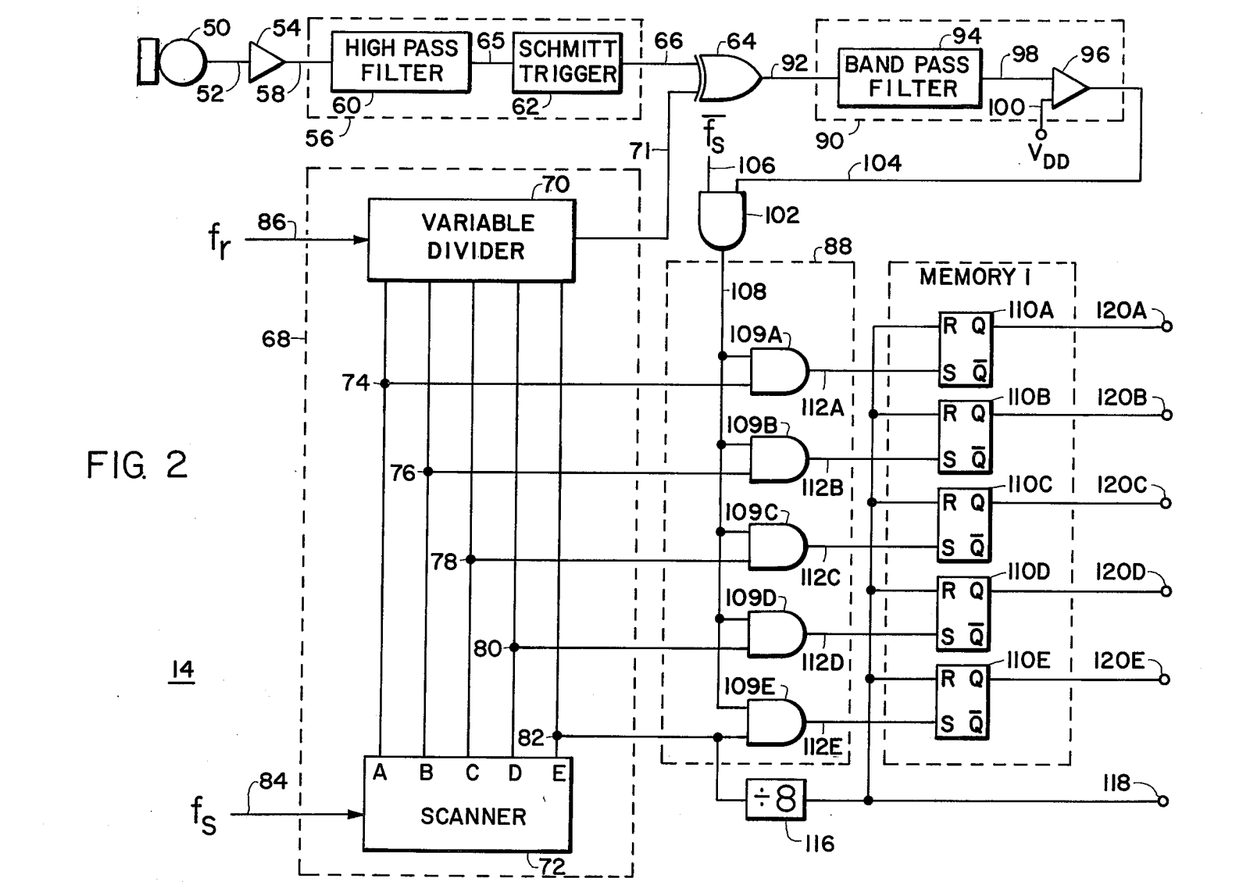
FIG. 2 is a block diagram representation of the first part of the heterodyne receiver.
Figure 3:
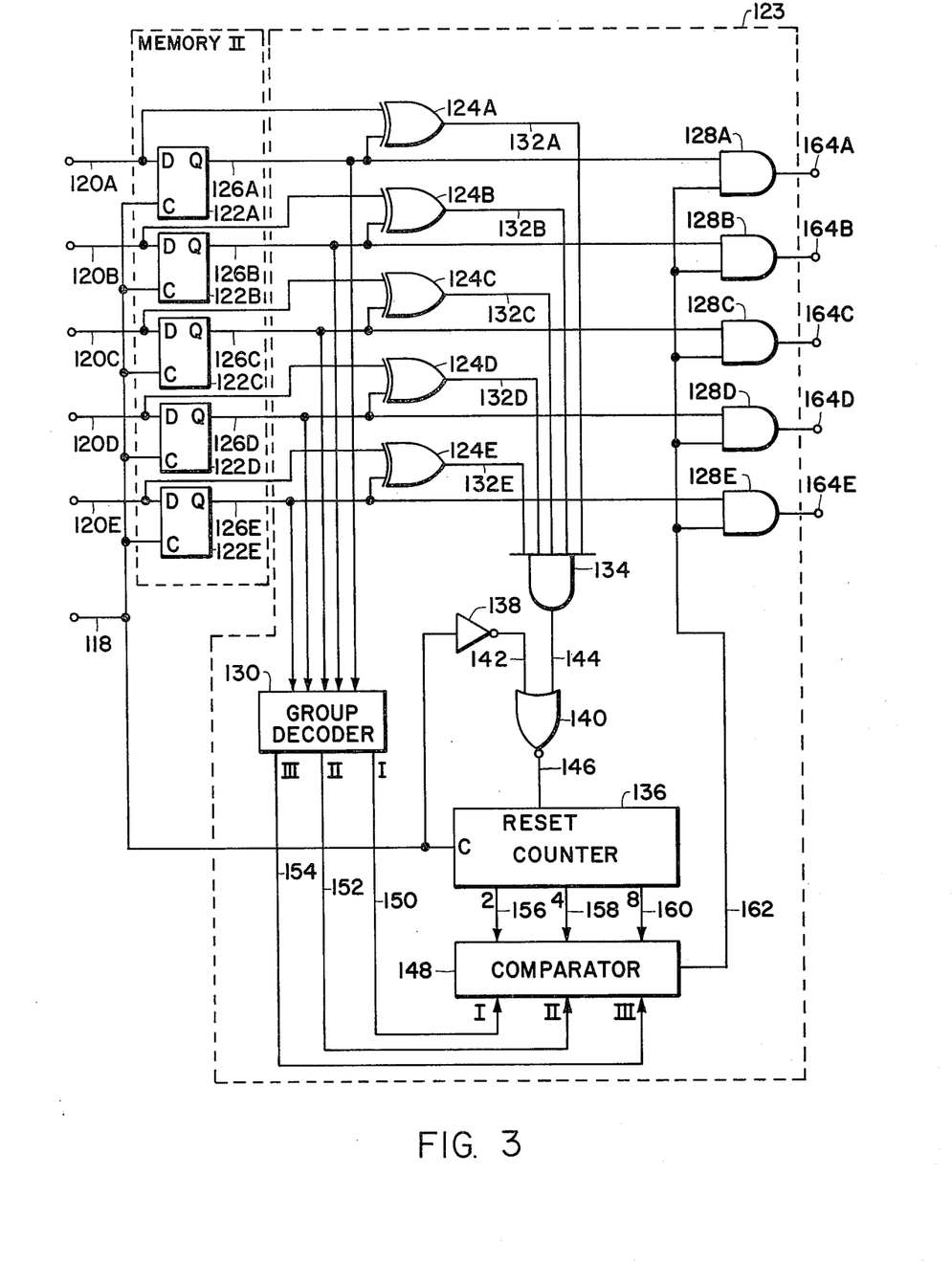
FIG. 3 is a block diagram representation of the remaining elements of the heterodyne receiver.

FIG. 2 and FIG. 3 together show a much more detailed representation of heterodyne receiver 14. In FIG. 2, transducer 50 converts the transmitted ultrasonic sound wave into an electrical signal. Conductor 52 couples the output of transducer 50 to preamplifier 54. The output of preamplifier 54 is coupled to the input stage 56 of the heterodyne receiver by conductor 58. Conductor 58 in FIG. 2 corresponds to input 12 in FIG. 1. The first element of input stage 56 is high pass filter 60 which performs the function of passing only signals having a frequency above a predetermined frequency. In this embodiment high pass filter 60 filters out all frequencies below 30 kilohertz. The output of high pass filter 60 is coupled to Schmitt trigger 62 by conductor 65. Schmitt trigger 62 amplitude limits the signal transmitted to it by high pass filter 60. The output of Schmitt trigger 62 is coupled to mixer 64 by conductor 66. An exclusive OR gate performs the function of the mixer 64. Frequency divider 68 is composed of variable divider 70 and scanner 72. Variable divider 70 is coupled to mixer 64 by conductor 71. Scanner 72 is coupled to variable divider 70 by a plurality of lines 74, 76, 78, 80 and 82. A frequency $f_s$ is coupled to scanner 72 by input line 84. Similarly, a reference frequency $f_r$ is coupled to variable divider 70 by input line 86. The plurality of outputs from scanner 72 such as 74 are also coupled to gating circuit 88. The output of mixer 64 is coupled to detector 90 by conductor 92. Band pass filter 94 is the first stage of detector 90 and generates an output which is coupled to comparator 96 by conductor 98. A comparison voltage VDD is coupled to comparator 96 by conductor 100. The output of comparator 96 is coupled to an AND gate 102 by conductor 104. A square wave $\bar{f_s}$ 180° out of phase with scanner input frequency $f_s$ is coupled to AND gate 102 by conductor 106. The output of AND gate 102 is coupled to gating circuit 88 by conductor 108. Gating circuit 88 is composed of five AND gates 109 A-E. The individual outputs of the AND gates 109 A-E are coupled to a series of RS flip-flops 110 A-E by a plurality of conductors 112 A-E. This group of five RS flip-flops 110 A-E is referred as memory I. A divide by eight counter 116 has its input coupled to line 82 of scanner 72 and its output coupled to each of the RS flip-flops 110 A-E contained in memory I by conductor 118. The outputs of the individual RS flip-flops contained 110 A-E in memory I are labeled 120 A-E. These outputs 120 A-E couple memory I to memory II.

Referring now to FIG. 3, it can be seen that the outputs of memory I at 120 A-E are coupled to a plurality of DC flip-flops 122 A-E contained in memory II. The output 118 of divide by 8 counter 116 is coupled to an input of each of the DC flip-flops 122 A-E in memory II. Additionally, each of the conductors 120 A-E is coupled to a plurality of exclusive OR gates 124 A-E. Each output of flip-flop 122 A-E is coupled to one of the plurality of exclusive OR gates 124 A-E as well as to an input of a plurality of AND gates 128 A-E. Each of the outputs of memory II is additionally coupled to a group decoder 130. Each of the plurality of exclusive OR gates 124 A-E has an output 132 A-E coupled to the input of an AND gate 134. The output 118 of divide by 8 counter 116 is additionally coupled to the clock input of a binary counter 136 and to the input of an inverter 138. The output of inverter 138 is coupled to an input of NOR gate 140 by conductor 142. The output of AND gate 134 is coupled to an input of NOR gate 140 by conductor 144. The output of NOR gate 140 is coupled to the reset input of counter 136 by conductor 146. The outputs of group decoder 130 are coupled to comparator 148 by conductors 150, 152 and 154. The outputs of counter 136 are coupled to comparator 148 by conductors 156, 158 and 160. The output of comparator 148 is coupled to each of the plurality of AND gates 128 A-E by conductor 162. The processed outputs of heterodyne receiver 14 are derived from a plurality of conductors 164 A-E from the plurality of AND gates 128 A-E.

Figure 4:
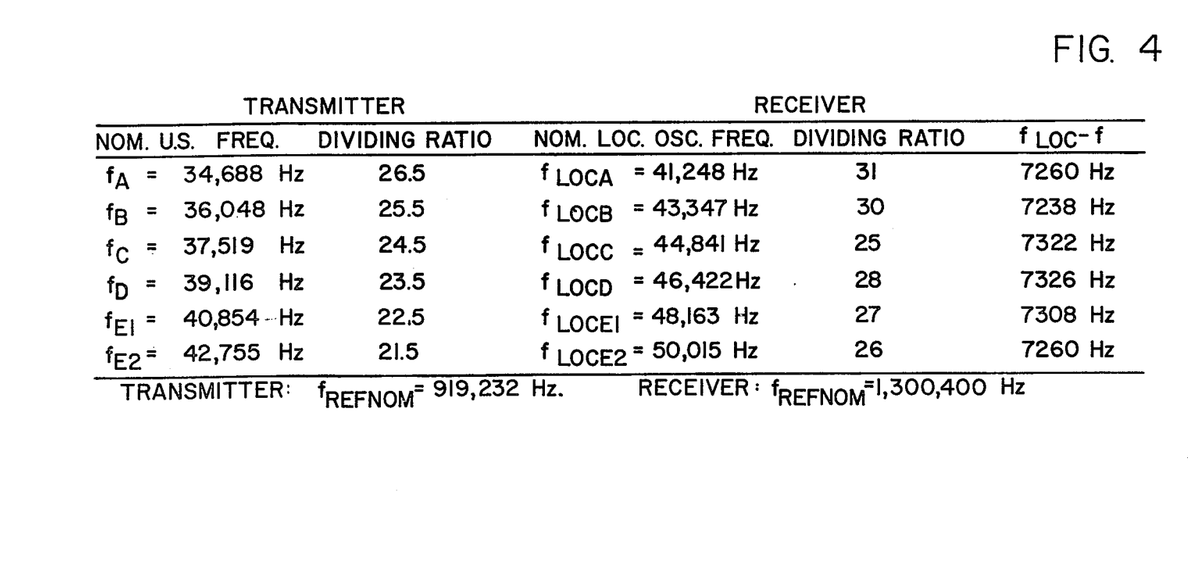
FIG. 4 is a table setting out the various transmitter and receiver operating frequencies and related dividing ratios.

FIG. 4 shows a table listing operating frequencies and dividing ratios of both the remote control transmitter and the remote control receiver.

The left-hand side of FIG. 4 refers to transmitter operation. The transmitter generates six frequencies, $f_A, f_B, f_C, f_D, f_{E1}$ and $f_{E2}$. In the current embodiment, the transmitter does not utilize $f_{E2}$ although this sixth output frequency is a possible alternative for increased flexibility of the remote control system. The transmitted frequencies $f_A$ through $f_{E2}$ are derived by dividing a transmitter reference frequency of 919,232 Hertz by a dividing ratio varying between 26.5 and 21.5 and having a spacing between each dividing ratio exactly equal to an integral number. The transmitter generates output frequencies between 34,688 Hertz and 42,755 Hertz. One complete transmitting cycle occurs during a 40 millisecond time interval. During this 40 millisecond interval there are four 10 millisecond subintervals. For each of the 22 commands which the transmitter is able to transmit to the receiver, there is a coded sequence of frequencies $f_A$–$f_E$ which is transmitted during each transmitter interval. Each subinterval will either contain one of the five frequencies or it could contain a blank where no pulse is transmitted. During one complete 40 millisecond transmitting interval, each of the transmitter frequencies $f_A$–$f_E$ will be used no mroe than one time. As long as a command button on the transmitter is held down the transmitter will continue to repeat the same 40 millisecond long coded signal. When the operator's finger is removed from the button the transmission will terminate. It has been found that an average push of a button on the transmitter will result in a transmission approximately 250 milliseconds (¼ second) in length.

The right-hand side of FIG. 4 shows a series of six receiver local oscillator frequencies varying in range from 41,248 Hertz to 50,015 Hertz. Again, the last receiver local oscillator frequency is an optional frequency for increased capacity and is not used in the current embodiment. Receiver localizer frequencies $f_{LOCA}$ through $f_{LOCE1}$ are generated by dividing a receiver reference frequency $f_r$ equal to 1,300,400 Hertz by a dividing ratio which varies between 31 and 25. Frequency divider 68 shown in FIG. 2 generates these five local oscillator frequencies. Scanner 72 is driven by square wave $f_s$ at input 84. Output A of scanner 72 causes variable divider 70 to divide reference frequency $f_r$ by 31 to generate $f_{LOCA}$ equal to 41,248 Hertz. $f_{LOCA}$ is the localizer frequency corresponding to a transmitted frequency of $f_A$. An output of scanner 72 at output B causes variable divider 70 to divide reference frequency $f_r$ by 30 causing an output $f_{LOCB}$ equal to 43,347 Hertz at the output 71 of variable divider 70. The same is true for outputs C, D and E of scanner 72.

Input frequency $f_s$ at 84 causes scanner 72 to generate an output at a different location A–E every 1.6 milliseconds. Therefore the output frequency of variable divider 70 also changes every 1.6 milliseconds, generating a new sequencially changing localizer frequency $f_{LOCA}$–$f_{LOCE}$.

Scanner 72 completes a scan of outputs A through E every 7.25 milliseconds and variable divider 70 sequentially generates localizer frequencies $f_{LOCA}$ through $f_{LOCE}$ during the same 7.25 millisecond scanning interval. Heterodyne receiver 14 is set up to require eight 7.25 millisecond scanning intervals for one complete receiving cycle. Approximately 60 milliseconds is required to complete receiving cycle. Extremely precise timing is not essential to the operation of this apparatus. Variations of up to ±0.5 percent are highly acceptable. The only criterion for the timing is that one complete receiving cycle must be completed in a time interval less than 10 milliseconds long which is the duration of each transmitter subinterval.

In heterodyne receiver 14 mixer 64 mixes the incoming signal at conductor 66 with the sequentially scanned series of localizer frequencies at input 71. The output of mixer 64 is composed of a frequency equal to the sum of the two frequencies at its input terminals together with the difference of the two frequencies at its input terminals; that is, the mixer 64 generates a sum and a difference signal. During any one transmitted 10 millisecond subinterval when there is a frequency burst occurring, the receiver will complete at least one full scan of all of the localizer frequencies from $f_{LOCA}$ through $f_{LOCE}$ and will produce a sum signal and a difference signal for each of the five localizer frequencies scanned.

The output of mixer 64 will be composed of five sum signals and five difference signals due to the combination of the unknown transmitted frequency and $f_{LOCA}$–$f_{LOCE}$. Band pass filter 94 is constructed to have a very narrow pass band such that it will allow only frequencies within a narrow range to be transmitted through it. All other frequencies outside of this frequency range will be rejected. In the present embodiment, band pass filter 94 is constructed to pass only signals having a frequency lying between 7000–7500 Hertz. Of the five sum signals and the five difference signals present at its input during any one transmitter subinterval, only those signals falling within a frequency range of 7000–7500 Hertz. will be passed by the band pass filter 94. If we assume that the particular transmitted subinterval which we are observing contains frequency $f_A$ equal to 34,688 as shown in FIG. 4, it can be seen that the sums of $f_A$ and $f_{LOCA}$–$f_{LOCE}$ will all be on the order of 80 kilohertz and will be well outside the pass band of the band pass filter 94. With respect to difference signals, $f_{LOCA}$ minus $f_A$ as is shown on the very far right-hand column of FIG. 4 is equal to 7260 Hertz which falls directly in the middle of the pass band of band pass filter 94. As it happens this is the only difference signal emanating from mixer 64 which will fall anywhere near the pass band of band pass filter 94. The difference between signals $f_A$ and $f_{LOCB}$–$f_{LOCE}$ will be significantly greater than the 7.5 kilohertz maximum pass band frequency of band pass filter 94 and none of these will pass through band pass filter 94.

Figure 5:
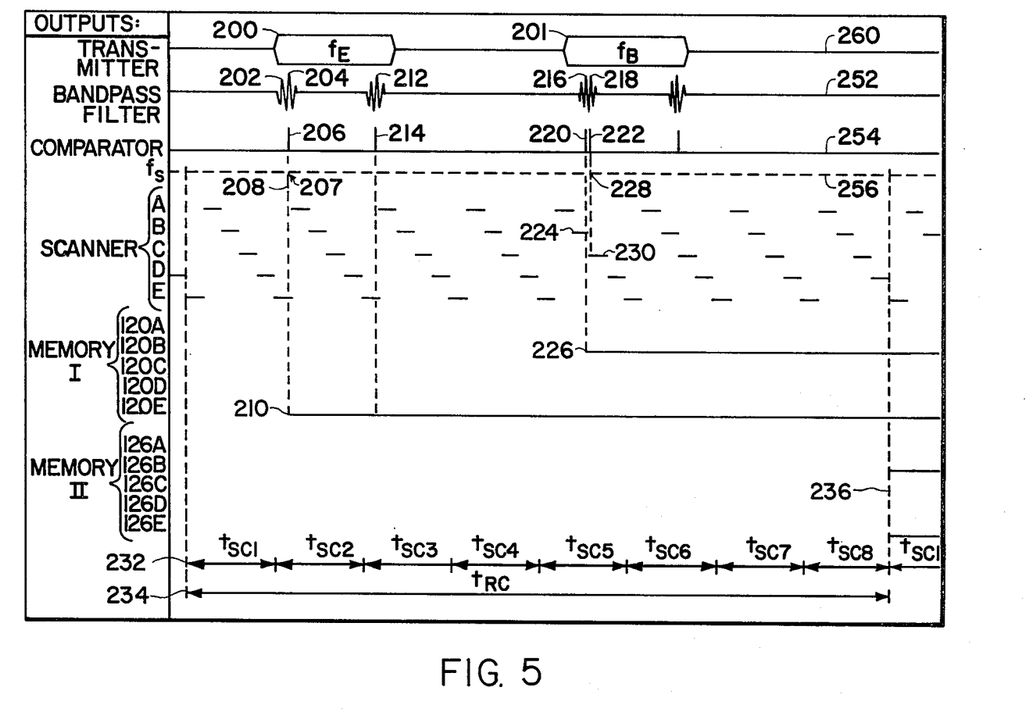
FIG. 5 is a timing diagram representative of the remote control receiver operation.

Referring now to FIG. 5, the upper line 250 labeled "transmitter", shows a series of transmitter subintervals. During the particular transmission shown transmitter frequencies $f_E$ at 200 and $f_B$ at 201 have been transmitted with a blank subinterval between them where no frequency is transmitted. Transmitted signals $f_E$ and $f_B$ are each 10 milliseconds in duration. The second line 252 in FIG. 5 shows the output of band pass filter 94. The presence of an input signal at the input of band pass filter 94 causes the output of band pass filter 94 to built up exponentially to a peak. Since the output of variable divider 70 produces a given localizer frequency for only 1.6 milliseconds, the duration of the difference signal at the input of band pass filter 94 will be only 1.6 milliseconds. Therefore the output of band pass filter 94 shown at 202 in FIG. 5 will build up to a maximum and then immediately begin to decay since the input signal will have been removed shortly after the band pass filter reaches its peak.

When the output of band pass filter 94 exceeds the voltage $V_{DD}$ present at input 100 of comparator 96 the comparator will generate a pulse whenever its input 98 is equal to or greater than $V_{DD}$. Reference 204 is used to illustrate the point at which the band pass filter output 98 exceeds $V_{DD}$. The output of comparator 96 at 104 is represented by line 254. This pulsed output of comparator 96 is fed by conductor 104 to AND gate 102. A signal $\overline{f_s}$ is present at terminal 106 of AND gate 102 to disable AND gate 102 during the first half of each 1.6 millisecond scanning subinterval. This gating is necessated by the fact that band pass filter 94 continues to have an output due to ringing for a short period of time following the cessation of an input since its inductive and capacitive components contain a voltage which does not decay to zero immediately. This 0.8 millisecond delay totally eliminates false indications due to ringing.

Line 256 in FIG. 5 shows the representation of $f_s$ and $\bar{f_s}$ represented by the space between the dashes on line 256. AND gate 102 will only generate an output at 108 when there is a higher output 104 from comparator 96 and a low or zero output due to $f_s$.

Dotted line 208 on FIG. 5 shows just this event occurring. At 206 there is an output present from the comparator 96 while at point 207 there is a space present in the $f_s$ square wave. These two conditions generate an output from AND gate 102 which is fed into comparison circuit 88. All of these events occur simultaneously in real time. The output at 108 is occurring simultaneously with the reception of the corresponding transmitted frequency burst. Since we are dealing with a transmitted subinterval 200 containing frequency $f_E$ scanner 72 will be generating a timing signal at output E. This scanner output at A also causes variable divider 70 to generate localizer frequency $f_{LOCE}$ at 71. During the second half of this 1.6 millisecond scanning subinterval AND gate 109E in gating circuit 88 will have a high level input due to the output of scanner 72 at conductor 82. AND gate 109E will also have a high level input present at conductor 108 due to the high output from AND gate 102. These two high inputs at conductors 82 and 108 cause a high output from AND gate 109E which is coupled to RS flip-flop 110E by conductor 112E. This sets RS flip-flop 110E and causes a high level output at output 120e.

In FIG. 5, reference 210 shows a memory I output 120E present from the time at which incoming frequency $f_E$ was detected. During the same transmitter subinterval 200 when frequency $f_E$ is being received it can be seen that there is another band pass filter output occurring at 212. When the amplitude of the signal 212 exceeds voltage $V_{DD}$ the comparator 96 generates an additional output at 214 corresponding to the $f_E$ input. The proper relationship such that the output of the comparator at 104 and the $\bar{f_s}$ signal present at input 106 of AND gate 102 are such that an additional output will be generated of AND gate 109E in gating circuit 88. This transmits a pulse to the set input of RS flip-flop 110E in memory I. Referring to line 210 in FIG. 5 again, it can be seen that RS flip-flop 110E is already carrying a high output level at output 120E so that no additional information is conveyed by this second receiver scan during the same transmitter subinterval containing frequency $f_E$.

In FIG. 5 during the transmitter subinterval containing frequency $f_B$ the output of the band pass filter exceeds $V_{DD}$ at both points 216 and 218 causing the comparator to generate two outputs 220 and 222. The output at 220 occurs at a time when $f_s$ is in a low state which causes AND gate 102 to produce a high level output. This high level output from AND gate 102 occurs at a time when scanner 72 is generating an output at B as shown by reference number 224 in FIG. 5. This causes the input AND gate 109B in gating circuit 88 to have two high level inputs which generates a high level output at 112B, which sets RS flip-flop 110B, and causes an output at output 120B. This memory I output is shown by line 226 in FIG. 5. The comparator output at reference number 222 occurs at a time when $f_s$ is at a high level and is shown by reference point 228. Since $\bar{f_s}$ will be in a low state AND gate 102 will be disabled so that the comparator output at 222 has no effect on any circuit following AND gate 102. The comparator output at is caused by an undesirable ringing effect in the band pass filter and would produce an inaccurate result if the disabling AND gate 102 were not present in the circuit. The band pass filter output at reference position 218 has overlapped into the scanner subinterval corresponding to a frequency $f_C$ as shown by point 230. This would have caused an output to have been generated during scanning subinterval C when a frequency $f_B$ was present at the input of the receiver.

In FIG. 5, line 232 shows the eight separate scanning intervals during one complete receiving cycle. The duration of one complete receiving cycle is shown by line 234. Each receiver scanning interval is designated by $t_{sc}$ and each of these scanning intervals is approximately to 7.25 milliseconds in duration. One complete receiving cycle designated by $t_{rc}$ is equal to 8 of these scanning intervals and is approximately 58 milliseconds in duration. The duration of one complete receiving cycle must be greater than the 40 millisecond duration of one complete transmitter cycle so that at least one complete transmit cycle is analyzed during every receiving cycle. The length of a receiving cycle was chosen to be substantially longer than that of a transmitter cycle to allow for wide variations in operating parameters.

At the end of one receiving cycle shown by line 236 in FIG. 5, divide by 8 counter 116 (shown in FIG. 2), generates an output pulse at output conductor 118 which simultaneously performs two functions. First, it clocks the outputs present at output conductors 120A–E into the DC flip-flop 112A–E of memory II. Simultaneously, output 118 resets each of the RS flip-flops 110A–E in memory I. This clocking pulse generated by divide by 8 counter 116 performs the function of transferring the stored data in memory I into memory II for use with comparison circuit 123 in the following stage.

Figure 6:
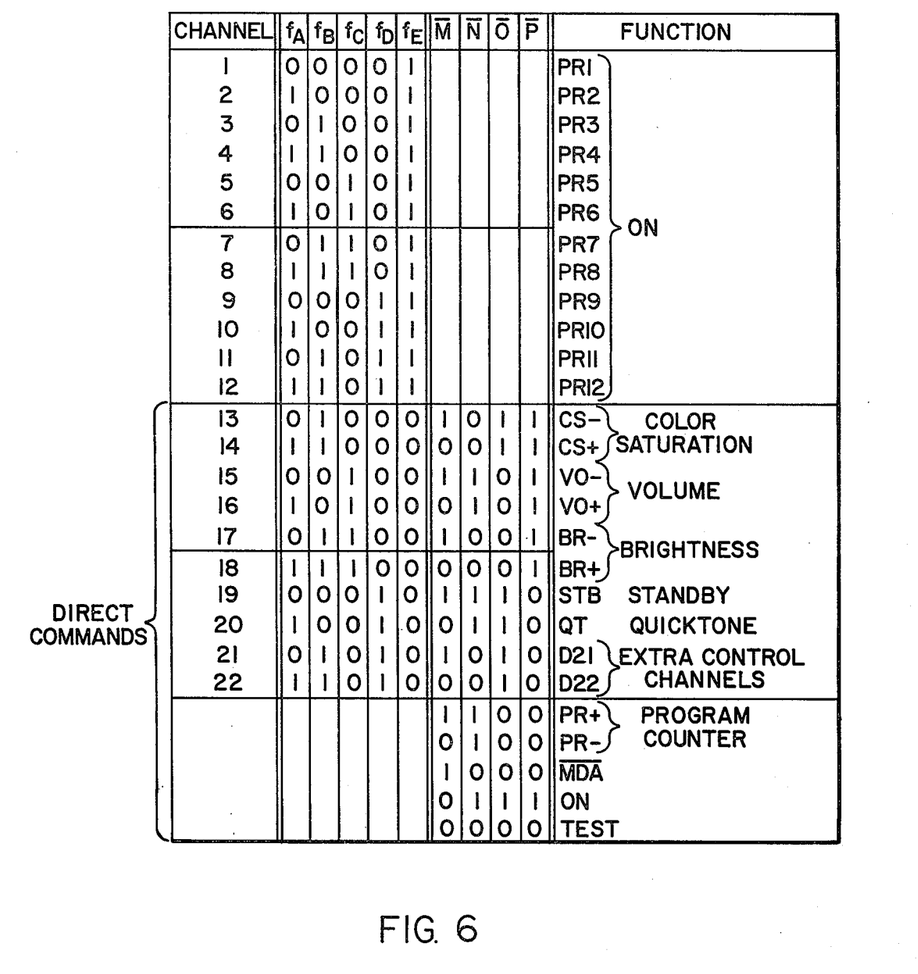
FIG. 6 is a table showing the various remotely controllable channels and the function performed by each channel.

FIG. 6 shows the 22 commands which can be executed remotely by this system. To improve the noise immunity of the ultrasonic remote control system, these 22 commands were divided into three groups. Group I consists of channels 13 through 22 excluding channel 19. Most of these controls fall into the analog category, such as brightness and volume, where a single noise induced error would be unobservable. Channels 1 through 12 control the selection of the program to be viewed. An error here would be highly undesirable since the television set would switch to the wrong station if an error induced by noise was present. Channels 1 through 12 in the remote control receiver system are placed into Group II. When the television set is in an "off" state and the user presses a button corresponding to a Channel 1 through 12, the remote control receiver system not only dials up the selected channel but also turns the television set on. Since having a noise induced signal cause the television set to switch on is very undesirable, this function is placed in Group II which has the highest degree of noise immunity. Channel 19 is also placed in Group III for a similar reason. Channel 19 performs the operation of turning the television from on to a standby state where only the remote control receiver is operating.

In FIG. 3 group decoder 130 in comparison circuit 123 has its inputs connected to the outputs of memory II at conductors 126A–E. Group decoder 130 decodes the outputs from memory II and determines whether that particular command falls into Group I, Group II or Group III. Group decoder 130 has three outputs connected to comparator 148. Output 150 corresponds to a Group I command, output line 152 to a Group II command and output line 154 to a Group III command. Comparator 148 will require the reception of two complete error-free receiving cycles prior to executing a Group I command. Comparator 148 will require four complete error-free receiving cycles before executing a Group II command and will require eight complete error-free receiving cycles before causing a Group III command to be executed.

The error checking is performed by a plurality of exclusive OR gates 124A–E. Each of these exclusive OR gates has one input connected to the input of memory II at conductors 120A–E while the other input of these exclusive OR gates is connected to the output of memory II at conductors 126A–E. Two receiving cycles must be completed to perform one comparison. At the end of two receiving cycles there will be an input from memory I present at lines 120A–E due to the second receiving cycle and there will be a stored input in memory II at outputs 126A–E corresponding to the stored outputs from the first receiving cycle. Each of the exclusive OR gates 124A–E compares the output generated by the first receiving cycle with the output generated by the second receiving cycle. If these are both the same, each of the exclusive OR gates will generate a high level output at 132A–E. If all of the outputs 132A–E are high, indicating that all the inputs are consistent, AND gate 134 will generate a high level output at output conductor 144. Inverter 138 inverts the output of divide by 8 counter 116 so that the logic will be proper. When divide by 8 counter 116 is generating a high level output at 118, 138 will be generating a low level output at conductor 142. If there have been no errors detected by Exclusive OR gates 124A–E, AND gate 134 will generate a high level output at conductor 144 and inverter 138 will generate a low level output at 142 causing NOR gate 140 to remain in a low state.

The output of divide by 8 counter 116 is coupled to counter 136 by conductor 118. The counter 136 counts the number of receiving cycles and generates an output at conductor 156 when two consistent receiving cycles are completed or an output at output conductor 158 when four consistent receiving cycles are completed or an output at conductor 160 when eight consistent receiving cycles are completed. When comparator 148 receives an output from counter 136 corresponding to the desired number of receiving cycles designated by the group decoder 130, comparator 148 generates an output pulse at output conductor 162 which is coupled to a plurality of AND gates 128A–E. This high level output from comparator 148 enables the plurality of AND gates 128A–E such that the output of memory II can be transmitted to the output of the comparator 123 at output conductors 164A–E. The output at 164A–E corresponds to the output of heterodyne receiver 14 at location 24 in FIG. 1. This output is completely error checked.

If during one of the receiving cycles one of the exclusive OR gates 124A–E detects an inconsistent pair of signals present at its input, it will generate a low level output at whichever output 132A–E that particular exclusive OR gate is coupled to. For instance, if exclusive OR gate 124A receives an inconsistent input (corresponding to an error) at its two input terminals, output conductor 132A will conduct a low level signal to AND gate 134. This will cause AND gate 134 to generate a low level output at conductor 144 and this low level output taken together with a low level output of inverter 138 at conductor 142 will cause NOR gate 140 to generate a high level output signal at conductor 146. This high level signal at conductor 146 is coupled to the reset input of counter 136 causing counter 136 to reset to zero so that its count begins again from zero. Counter 136 must then count an entire new set of receiving cycles as commanded by group decoder 130 until comparator 148 senses a count from counter 136 corresponding to the desired number of counts commanded by group decoder 130. Once this number is reached comparator 148 enables AND gates 128A–E by its output at 162.

A Group I signal thus will require two complete error-free receiving cycles prior to having the comparator 123 generate an output. This produces one comparison between two subsequent signals. A Group II signal requires four complete receiving cycles resulting in three comparisons between four subsequent transmitted signals. A Group III signal requires eight complete receiving cycles and generates a total of seven comparisons resulting in a highly accurate signal and an extremely high immunity from noise.

As has been mentioned before the average transmitted pulse is approximately 240 milliseconds in duration. To either turn the television set off or to turn the television set on requires the reception of eight complete error-free receiving cycles. This takes on the order of 500 milliseconds or about one-half second. There is a noticeable time lag between the time the user presses the desired remote control button and the time when the TV executes the desired command. The user will continue to hold the button down until the television set responds to his command at which time he will remove his finger from the button on the transmitter. This slight time delay for Group III commands presents no difficulty to the user.

A number of extremely difficult problems had to be overcome before an ultrasonic heterodyne receiver system compatible with a television set could be constructed. It was not at all apparent that these difficulties could be overcome. It was impractical to design a heterodyne receiver having local oscillator frequencies equal to those of the transmitted signals since the receiver would have had to detect a zero difference frequency and this would have prevented the use of an amplitude detector. If the variable frequency local oscillator signal is frequency modulate, a zero beat frequency technique can be used. This produces a beat frequency on the order of 30Hz. This approach requires significantly more complex circuitry than the present invention and requires a substantially longer processing time to detect the transmitted signal when sequentially transmitted coded frequencies are used.

With the inherent problems due to noise an amplitude detector was mandated. A system using a zero difference frequency detector was totally impractical. It was determined that the receiver frequency must be different from the transmitter frequency by some constant amount. The simplest and least expensive way of generating a series of frequencies corresponding to transmitter frequencies $f_A$–$f_{E2}$ and receiver localizer frequencies $f_{LOCA}$–$f_{LOCE}$ is to take a reference frequency and divide it by a series of varying dividing ratios. FIG. 4 shows that dividing ratios between 26.5 and 21.5 were used for the transmitter and dividing ratios 31 through 26 were used for the receiver. The difference between the receiver local oscillator frequencies $f_{LOCA}$–$f_{LOCE}$ must differ from the corresponding transmitted frequencies $f_A$–$f_E$ by an amount which falls within pass band (7000–7500 Hz) of the band pass filter.

Design requirements mandated that the dividing ratios be spaced an integral number apart. For example, the dividing ratios corresponding to $f_A$ and $f_B$ differ by 1 (e.g. 26.5 minus 25.5 equals a difference of 1). If very precisely defined dividing ratios were used, the complexity of the variable divider circuitry would have been greatly increased. This requirement created a very difficult problem in that it then became very difficult to maintain a constant difference between corresponding transmitter frequencies and the receiver local oscillator frequencies since each is derived by dividing a different reference frequency by a different dividing ratio.

Figure 7:
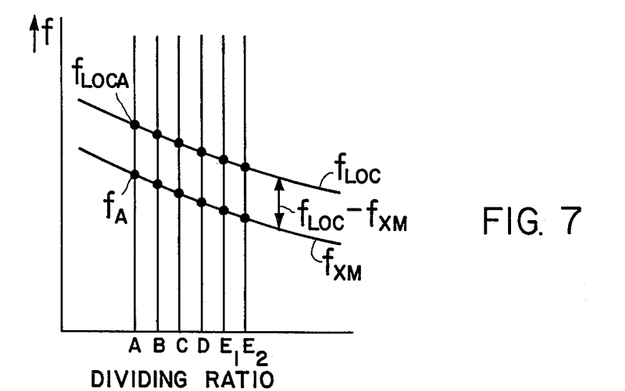
FIG. 7 is a graph showing the relationship of the transmitter frequencies to the receiver local oscillator frequencies.

FIG. 7 shows a curve labelled $f_{LOC}$ which corresponds to the localizer frequencies generated by dividing the receiver reference frequency of 1,300,400 Hz. by dividing ratios A–E. This produces a hyperbolic curve designated $f_{LOC}$. To generate the transmitter frequencies corresponding to frequencies $f_A$–$f_E$, a different reference frequency of 919,232 Hz. and a different set of dividing ratios is used. This generates another different hyperbolic curve $f_{XM}$ as is shown in FIG. 7. Since the spacing and shape of curves $f_{LOC}$ and $f_{XM}$ differ (the two curves are not parallel even though they appear to be so in FIG. 7) the difference between $f_{LOC}$ and $f_{XM}$ shown by line "$f_{LOC}$ minus $f_{xm}$" continually varies. As was pointed out before, the difference ($f_{LOC}$ minus $f_{XM}$) must fall within the pass band (7000–7500 Hz) of the band pass filter. Attempting to generate a set of frequencies having small range of allowable differences was further complicated by the fact that it is undesirable to use a reference frequency which is extremely high as this also complicates the circuitry. Another restriction was that the dividing ratios must be fairly low to simple construction and to avoid using an excessively high reference frequency.

The design was further complicated by the fact that all television sets have a horizontal oscillator frequency on the order of 15 kiloHertz which is very large in amplitude. The horizontal oscillator generates a number of harmonics shown in FIG. 8 by $f_2$, $f_3$, and $f_4$ which are multiples of the 15 kiloHertz horizontal oscillator frequency. It was determined that the ultrasonic receiver system should operate between the second and third harmonic of the horizontal oscillator frequency so that there would be no interference caused by reception of this very dominant horizontal oscillator frequency and its harmonics. This restricts the bandwidth available for the remote control system and again further complicates the choice of transmitter frequencies and local oscillator frequencies.

Figure 8:
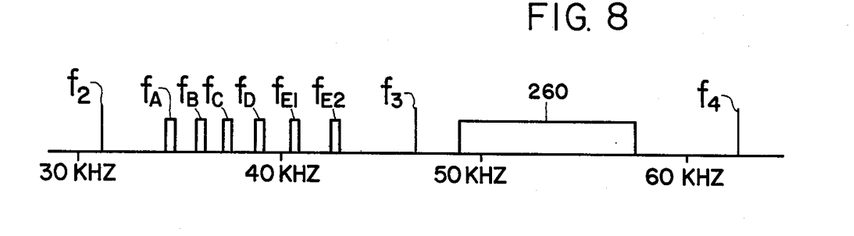
FIG. 8 shows the relationship of the receiver system operating frequencies to other potentially interfering signals.

A further difficulty which complicates the choice a pass band frequency for the band pass filter is that there is a mirror frequency band shown in FIG. 8 by reference 260 to which the receiver is equally sensitive. This mirror frequency band lies in a range of frequencies beginning at $f_A$ plus 2 times the band pass frequency as a low point, to $f_{E2}$ plus 2 times the band pass frequency. As an example, since $f_{LOCA}$ lies above the transmitter frequency $f_A$ by 7260 Hertz, the difference between $f_A$ and $f_{LOCA}$ of 7260 Hertz is passed by the band pass filter. However, the receiver will be equally sensitive to an interferring signal lying above $f_A$ by a frequency on the order of 7300 Hz. FIG. 8 shows the receiver mirror frequency band 280 lying between approximately 48 kiloHertz to approximately 59 kiloHertz. The pass band of the band pass filter was chosen to be equal to approximately one-half the receiver horizontal oscillator frequency such that the mirror frequency band would not enclose one of the harmonics of the horizontal oscillator shown at $f_3$ and $f_4$. If the mirror frequency band enclosed one of these horizontal oscillator harmonics, the operation of the receiver would be totally unreliable due to reception of the very strong signal caused by the horizontal oscillator. This requirement further complicated the design of a practical ultrasonic heterodyn receiver which was operationally compatible with a television receiver.

It will be apparent to those skilled in the art that the disclosed apparatus for receiving coded commands transmitted by ultrasonic sound waves for remotely controlling various functions of a television receiver may be modified in numerous ways and may assume many embodiments other than the one preferred form specifically set out and described above. For example, additional control channels may be provided which will increase the flexibility of the apparatus. Further, the receiver system is readily adaptable for use with television receivers having different horizontal oscillator frequenices, such as those used in Europe which have a lower frequency horizontal oscillator, without any modification whatsoever due to the fairly large tolerances accepted by the system. In addition, it is possible that by using the same principle and with slight modifications that this invention system could be adapted for use with a transmitter operating in the infrared frequency range. Accordingly, it is intended by the appended claims to cover all such modifications of the invention which fall within the true spirit and scope of the invention.

What is claimed is:

1. An asynchronous receiver for remotely controlling an apparatus comprising:
   a. input stage means for receiving during successive receiving cycles an incoming signal comprising repetitive groups of serially received frequency bursts, each burst having one of a plurality of frequencies, said incoming signal having a frequency range residing between harmonic frequencies of interfering signals;
   b. frequency divider means for sequentially generating a plurality of localizer frequencies at a first output terminal means and a plurality of timing signals at a second output terminal means, each timing signal being associated with one of said plurality of localizer frequencies.
   c. mixing means coupled to said input stage means and to said first output terminal means for generating sum and difference signals in response to said incoming signal and said plurality of localizer frequencies;
   d. detector means coupled to said mixing means for transmitting signals of a selected frequency and amplitude range; and e. gating means coupled to said detector means and to said second output terminal means, each being responsive to one of said plurality of timing signals, for generating during said successive receiving cycles successive groups of digital signals, each of said digital signals being representative of one of said plurality of received frequency bursts.

2. An asynchronous receiver for remotely controlling an apparatus according to claim 1 further including:
   a. memory means coupled to said gating means for storing said digital signals.

3. An asynchronous receiver for remotely controlling an apparatus according to claim 1 further including:
   a. error checking means coupled to said memory means for comparing said successive groups of digital signals in order to provide error-free operation.

4. An asynchronous receiver for remotely controlling an apparatus according to claim 1 wherein:
   a. said detector means includes a band pass filter.

5. An asynchronous receiver for remotely controlling an apparatus according to claim 1 wherein:
   a. said mixing means comprises a digital logic means.

6. An asynchronous receiver for remotely controlling an apparatus according to claim 3 wherein said error checking means further includes:
   a. a plurality of logic gates;
   b. group decoder means coupled to said logic gates and to a comparator means;
   c. resettable counter means coupled to said logic gates and to said comparator means; and
   d. comparator means coupled between said group decoder means and said resettable counter means.

7. An asynchronous ultrasonic receiver for remotely controlling a television receiver comprising:
   a. input stage means for receiving during successive receiving cycles an incoming ultrasonic signal comprising repetitive groups of serially received frequency bursts, each burst having one of a plurality of frequencies, said incoming signal having a frequency range residing between a second and third harmonic of a television horizontal oscillator frequency;
   b. frequency divider means for sequentially generating a plurality of localizer frequencies at a first output terminal means and a plurality of timing signals at a second output terminal means, each timing signal being associated with one of said plurality of localizer frequencies.
   c. mixing means coupled to said input stage means and to said first output terminal means for generating sum and difference signals in response to said incoming signal and said plurality of localizer frequencies;
   d. detector means coupled to said mixing means for transmitting signals of a selected frequency and amplitude range; and
   e. gating means coupled to said detector means and to said second output terminal means, each being responsive to one of said plurality of timing signals, for generating during said successive receiving cycles successive groups of digital signals, each of said digital signals being representative of one of said plurality of received frequency bursts.

8. An asynchronous ultrasonic receiver for remotely controlling a television receiver according to claim 7 further including:
   a. memory means coupled to said gating means for storing said digital signals.

9. An asynchronous ultrasonic receiver for remotely controlling a television receiver according to claim 7 further including:
   a. error checking means coupled to said memory means for comparing said successive groups of digital signals during a predetermined number of error-free receiving cycles.

10. An asynchronous ultrasonic receiver for remotely controlling a television receiver according to claim 7 wherein:
    a. said detector means includes a band pass filter.

11. An asynchronous ultrasonic receiver for remotely controlling a television receiver according to claim 7 wherein:
    a. said mixing means comprises a digital logic means.

12. An asynchronous ultrasonic receiver for remotely controlling a television receiver according to claim 9 wherein said error checking means further includes:
    a. a plurality of logic gates;
    b. group decoder means coupled to said logic gates and to a comparator means;
    c. resettable counter means coupled to said logic gate and to said comparator means; and
    d. comparator means coupled between said group decoder means and said resettable counter means.

13. An asynchronous ultrasonic receiver for remotely controlling a television receiver according to claim 7 wherein:
    a. said ultrasonic remote control receiver can be substantially completely constructed on a single integrated circuit chip.

14. In an asynchronous receiver comprising:
    a. input means for receiving during successive receiving cycles an incoming signal comprising repetitive groups of serially received frequency bursts, each burst having one of a plurality of frequencies;
    b. frequency divider means for sequentially generating a plurality of offset frequency signals, offset from said incoming signals, and a plurality of timing signals, each timing signal being associated with one of said plurality of offset frequency signals; and
    c. detector means coupled to said input means and said frequency divider means for identifying a predefined correspondence between said incoming signal and said offset frequency signals.

* * * * *